LOGIC CIRCUITS EMPLOYING COMPLEMENTARY PAIRS
OF FIELD-EFFECT TRANSISTORS

Filed Dec. 30, 1965

INVENTORS
JOSEPH R. BURNS &
J. JAMES GIBSON
BY John V. Regan
Attorney

United States Patent Office 3,449,594
Patented June 10, 1969

1 2

3,449,594

LOGIC CIRCUITS EMPLOYING COMPLEMENTARY PAIRS OF FIELD-EFFECT TRANSISTORS

John James Gibson, Princeton, and Joseph R. Burns, Trenton, N.J., assignors to Radio Corporation of America, a corporation of Delaware Filed Dec. 30, 1965, Ser. No. 517,562
Int. Cl. H03k *19/08*
U.S. Cl. 307—251 8 Claims

ABSTRACT OF THE DISCLOSURE

Two conduction paths, each comprising the series-connected source-to-drain channel of two field-effect transistors of different conductivity types. One end of each path may be connected to a source of reference potential, such as ground and the other end of each path may serve as first and second signal input terminals, respectively. One or a number of signals may be applied to the gate electrodes of the four transistors. There may be a signal output terminal in each path at the connection between the two channels of the path and the output terminal of one path may be connected to the other end of the second path.

This invention relates to gate circuits. More specifically the present invention relates to field-effect transistor gate circuits.

An object of the present invention is to provide an improved gate circuit using field-effect transistors.

Another object of the present invention is to provide an improved gate circuit for performing logic gating functions.

A further object of the present invention is to provide an improved logic circuit using field-effect transistors.

A still further object of the present invention is to provide an improved logic circuit using cascaded field-effect transistors.

In accomplishing these and other objects, there has been provided a logic gating circuit having a first complementary pair of field-effect transistors controlled by a first input signal and arranged to provide a control function over a second complementary pair of field-effect transistors cascaded therewith. The second pair is controlled by a second input signal to provide a logic output signal in combination with the first input signal. Such logic gating circuits are useful in circuit arrays where a single control signal may be used to control a plurality of final output signals. For example, in the illustrated embodiment of the invention, the output signals are used as "read" and "write" signals for a digital computer memory. The control signal for this application may be derived from the computer program to provide a selective flow of information either in or out of the memory device.

Figure 1:
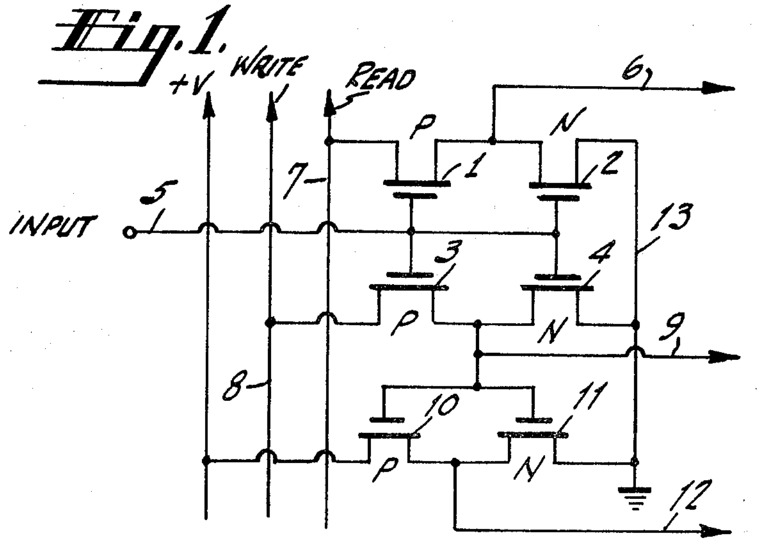
Figure 2:
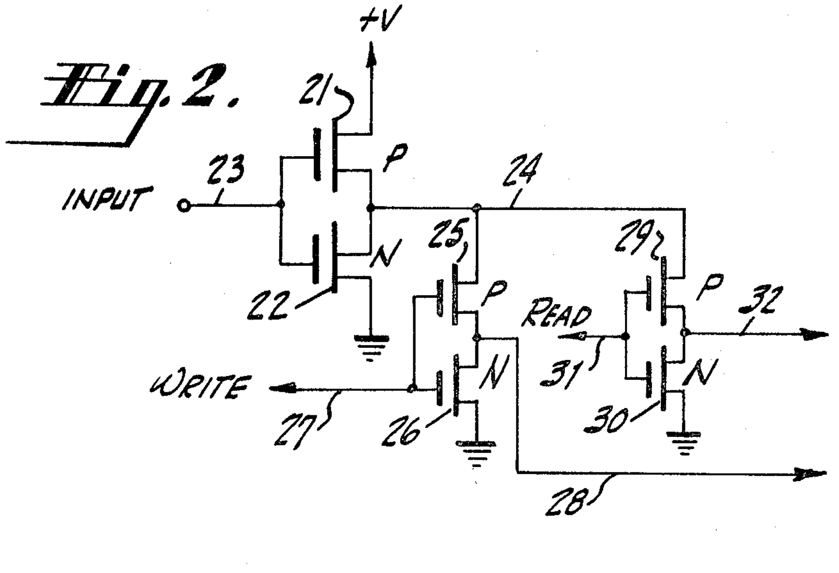

A better understanding of the present invention may be had when the following detailed disclosure is read in connection with the accompanying drawings, in which:

FIGURE 1 is a schematic illustration of a gating circuit embodying the present invention; and FIGURE 2 is a schematic illustration of another embodiment of the present invention.

Referring to FIGURE 1 in more detail, there is shown a gating circuit having a first complementary field-effect transistor pair 1 and 2. A suitable device for each of these elements is an insulated-gate, metal-oxide-silicon (MOS) semiconductor. A second complementary transistor pair 3 and 4 is arranged with its insulated-gate electrodes tied in common to the gate electrodes of the first pair 1 and 2 and to an input signal line 5. The drain electrode of the first transistor 1 is connected to the source electrode of the second transistor 2 and to a first output line 6. The source electrode of the first transistor 1 is connected to an input "read" signal line 7.

The source electrode of the third transistor 3 is connected to an input "write" signal line 8. The drain electrode of the third transistor 3 is connected to the source electrode of the fourth transistor 4 and to a second output line 9. A third complementary pair of field-effect transistors 10, 11 is arranged to have their gate electrodes connected to the second output line 9. The source electrode of the fifth transistor 10 is connected to a source +V, while the drain electrode is connected to the source electrode of the sixth transistor 11 and to a third output line 12. The drain electrodes of the second, fourth and sixth transistors 2, 4 and 11 are connected to a common ground line 13.

In operation, the circuit shown in FIGURE 1 is effective to selectively provide output signals on the output lines 6, 9, and 12. For example, an input signal on the "read" line 7 in combination with a control signal on the input line 5 is used to gate the "read" signal to the output line 6. Specifically the control signal for the gating operation is one which turns "on" transistor 1 and turns "off" transistor 2. During a non-gating condition, the control signal is arranged to turn "off" transistor 1 and turn "on" transistor 2 to connect the output line 6 to ground and terminate the signal gating condition.

Similarly, the "write" input signal is gated to output line 9. The signal on output line 9 is, also applied to the gate electrodes of the third pair comprising the fifth and sixth transistors 10, 11. This third pair is effective to provide a logical inversion, i.e. the output signal on line 12 is present at the time that the output signal on line 9 is interrupted by the control signal on the control line 5. Since the third pair 10, 11 is always connected to the source +V, the only control action is provided by the output signal on line 9 applied to the gate electrodes of the third pair 10, 11. The output signal on line 12, accordingly, is a representation of the presence of the control signal on line 5 which control signal is effective to prevent an output signal on output lines 6 and 9.

In FIGURE 2, there is shown another embodiment of the present invention having a first complementary transistor pair 21, 22 comprising a first field-effect transistor 21 and a second complementary transistor 22. The gate electrodes of first and second transistors 21 and 22 are connected to a gate control input signal line 23. The source electrode of the first transistor 21 is connected to a source +V while the drain electrode is connected to the source electrode of the second transistor 22 and to a control line 24. The drain electrode of the second transistor 22 is grounded.

A second complementary pair of field-effect transistors 25, 26 have their gate electrodes connected to a common "write" input signal line 27. The source electrode of the third transistor 25 is connected to the control line 24 while the drain electrode is connected to the source electrode of the fourth transistor 26 and to a first output line 28. A third complementary field-effect transistor pair 29, 30 has its gate electrodes connected to a "read" input signal line 31. The source electrode of the fifth transistor 29 is connected to control line 24 while the drain electrode is connected to a source electrode of the sixth transistor 30 and to a second output line 32. The drain electrodes of the fourth and sixth transistors 26 and 30 are grounded.

In operation, the circuit shown in FIGURE 2 provides a selective gating control of the output signals on output lines 28 and 32 by the input control signal on line 23. This control signal is effective to selectively connect the line 24 to either the source +V or ground the first complementary pair 21 and 22. Thus, the second and third pair 25, 26 and 29, 30 are energized by the source +V when the first field-effect transistor 21 is turned "on" while the second transistor 22 is turned "off" by the signal on input line 23. In this state, the "read" and "write" input signals are effective to selectively provide output signals on output lines 32 and 28, respectively. For example, assuming the input signal on line 23 is effective to turn "on" transistor 21, the "write" signal applied to line 27 is arranged to turn "on" transistor 25 and turn "off" transistor 26 to provide an output signal on output line 28.

Accordingly, it may be seen that there has been provided, in accordance with the present invention, a signal gating circuit comprising cascaded field-effect transistors for performing logic gating operations.

What is claimed is:

1. A signal gating circuit comprising a first complementary field-effect transistor pair, first input signal means connected to said transistor pair and operative to selectively place one transistor of said pair in an operating state, a second complementary field-effect transistor pair, circuit means connecting an output signal from said first pair as an input signal to said second pair, second input signal means arranged to provide an output signal from said second pair in combination with said first input signal and output signal means connected to said second pair to provide said output signal as an indication of a conducting state of a predetermined one of the transistors in said record pair, said first input signal means being connected to the gate electrodes of said first transistor pair and said output signal from said first transistor pair being applied to a source electrode of a transistor of said second transistor pair.

2. In combination:

two conduction paths, each with an input and an output terminal, each conduction path comprising the source-to-drain channel of a first field-effect transistor in series with the source-to-drain channel of a second field-effect transistor of different conductivity type than the first transistor, each transistor having a control electrode for controlling the conduction through its channel;

means for applying first and second signals to the respective input terminals of said conduction paths;

means for connecting the output terminal of each conduction path to a source of reference potential;

a common connection to which all of said control electrodes are connected;

means for applying a third signal to said common connection; and two signal output terminals, one on the first and the other in the second conduction path, each output terminal at the connection between the first and second transistor of its path.

3. In the combination set forth in claim 2, the two transistors in each conduction path comprising a P-type transistor and an N-type transistor.

4. In the combination as set forth in claim 2, each input terminal comprising the source electrode of a transistor.

5. In combination:

two conduction paths, each with an input and an output terminal, each conduction path comprising the source-to-drain channel of a first field-effect transistor in series with the source-to-drain channel of a second field-effect transistor of different conductivity type than the first transistor, each transistor having a control electrode for controlling the conduction through its channel;

means for applying a first signal to the control electrodes of the first conduction path and a second signal to the control electrodes of the second conduction path;

means for connecting the output terminal of each conduction path to a source of reference potential; and two signal output terminals, one in the first and the other in the second conduction path, each signal output terminal at the connection between the first and second transistor of its path, the signal output terminal of the first path connected to the input terminal of he second path.

6. In the combination set forth in claim 5, each conduction path including a P-type transistor and an N-type transistor.

7. In the combination set forth in claim 5, the signal output terminal in said first path being connected to the source electrode of a transistor in said second path.

8. In combination:

a first pair of field-effect transistors of different conductivity types, each having two electrodes separated by a channel defining a conduction path through the transistor and a control electrode for controlling the conductivity of said path, said transistors being connected with their conduction paths in series and the common connection between said paths serving as a first output terminal;

a second pair of field-effect transistors of different conductivity types connected to one another in the same way as the first pair of field-effect transistors with the common connection between the paths of said second pair of transistors serving as a second output terminal;

a common connection to which the four control electrodes are directly connected;

means for applying a signal to said common connection for said control electrodes which, when of one value causes the conduction path through one transistor of each pair to assume a relatively high impedance condition and the conduction path of the other transistor of each pair to assume a relatively low impedance condition and when of another value causes the respective paths to reverse their impedance conditions;

a common terminal connected to the electrodes at one end of the two series-connected conduction paths to a source of reference potential which, when said signal applied to said control electrodes is of one value permits current flow through the conduction path of one transistor of each pair;

means for applying a second signal to the electrode at the other end of the series-connected conduction paths of one pair of transistors for applying a signal thereto which, when of one value prevents current from being conducted through the conduction path of the transistor for that electrode and when of another value, permits current to be conducted through the conduction path of that transistor; and means for applying a third signal to the electrode at the other end of the series-connected paths of the second pair of transistors which, when of one value prevents current from being conducted through the conduction path of the transistor for that electrode and, when of another value, permits current to be conducted through the conduction path of that transistor.

References Cited

UNITED STATES PATENTS

| | | | |
|---|---|---|---|
| 3,260,863 | 7/1966 | Burns et al. | 307—251 X |
| 3,267,295 | 8/1966 | Zuk | 307—205 |

DONALD D. FORRER, *Primary Examiner.*

U.S. Cl. X.R.

307—205, 304